United States Patent
Gao

(10) Patent No.: US 11,889,658 B2
(45) Date of Patent: Jan. 30, 2024

(54) IMMERSION COOLING SYSTEM HAVING DUAL FLUID DELIVERY LOOPS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 73 days.

(21) Appl. No.: 17/475,266

(22) Filed: Sep. 14, 2021

(65) Prior Publication Data
US 2023/0084765 A1   Mar. 16, 2023

(51) Int. Cl.
*H05K 7/20*   (2006.01)

(52) U.S. Cl.
CPC ..... *H05K 7/20272* (2013.01); *H05K 7/20236* (2013.01); *H05K 7/20254* (2013.01); *H05K 7/20781* (2013.01)

(58) Field of Classification Search
CPC .......................................... G06F 1/20
See application file for complete search history.

(56) References Cited

U.S. PATENT DOCUMENTS

| | | | | |
|---|---|---|---|---|
| 7,905,106 | B2 * | 3/2011 | Attlesey | H05K 7/20772 165/80.4 |
| 11,452,241 | B2 * | 9/2022 | Tufty | H05K 7/20781 |
| 11,751,359 | B2 * | 9/2023 | Heydari | H05K 7/20272 361/699 |
| 2008/0128114 | A1 * | 6/2008 | Lai | H01L 23/473 165/80.4 |
| 2017/0265328 | A1 * | 9/2017 | Sasaki | H05K 7/20781 |
| 2019/0145003 | A1 * | 5/2019 | Chen | C23C 16/45578 118/715 |
| 2020/0015383 | A1 * | 1/2020 | Gao | H05K 7/20763 |
| 2020/0037467 | A1 * | 1/2020 | Ishinabe | H05K 7/20236 |
| 2020/0257342 | A1 * | 8/2020 | Mao | H05K 7/20272 |
| 2020/0352058 | A1 * | 11/2020 | Zhong | H05K 7/20272 |
| 2021/0185850 | A1 * | 6/2021 | Kulkarni | H05K 7/20327 |
| 2022/0104394 | A1 * | 3/2022 | Boyd | H05K 7/20272 |
| 2022/0264768 | A1 * | 8/2022 | Horng | H05K 7/20327 |
| 2022/0322562 | A1 * | 10/2022 | Chehade | H05K 7/20336 |
| 2022/0322570 | A1 * | 10/2022 | Meneboo | H05K 7/20772 |
| 2022/0361381 | A1 * | 11/2022 | Sweeney | H05K 7/20781 |

\* cited by examiner

*Primary Examiner* — Jacob R Crum
*Assistant Examiner* — Matthew Sinclair Muir
(74) *Attorney, Agent, or Firm* — WOMBLE BOND DICKINSON (US) LLP

(57) ABSTRACT

Immersion cooling system for electronics. The electronics are immersed in immersion tank filled with immersion liquid. A universal supply utilizes a supply panel to fill cooled liquid into the tank. Localized supply utilizes a manifold to deliver cooled liquid to specific devices within the tank. Cooled liquid is delivered via connection of the manifold and the flexible hoses to cooling plates mounted onto the devices. Each of the cooling plates has a cavity for passing cooled liquid, a supply inlet connected to one of the flexible hoses, and an outlet hole releasing the liquid into the tank. The cooled liquid is supplied to the universal supply from a main cooler. The cooled liquid is supplied to the manifold from the main cooler or from a secondary cooler. The immersion tank has a single recirculation outlet to return liquid mixed from both the universal supply and the localized supply.

16 Claims, 7 Drawing Sheets

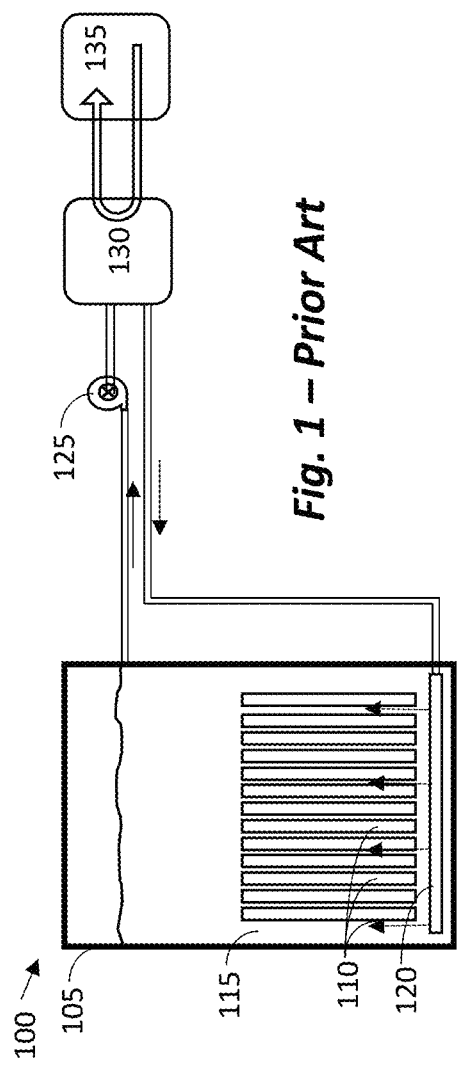
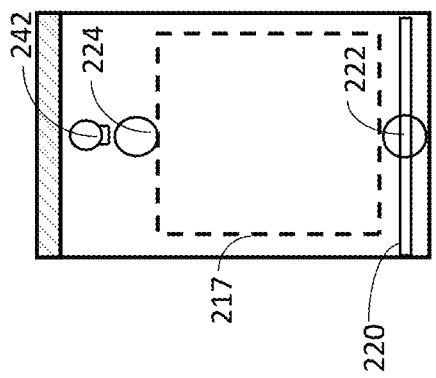
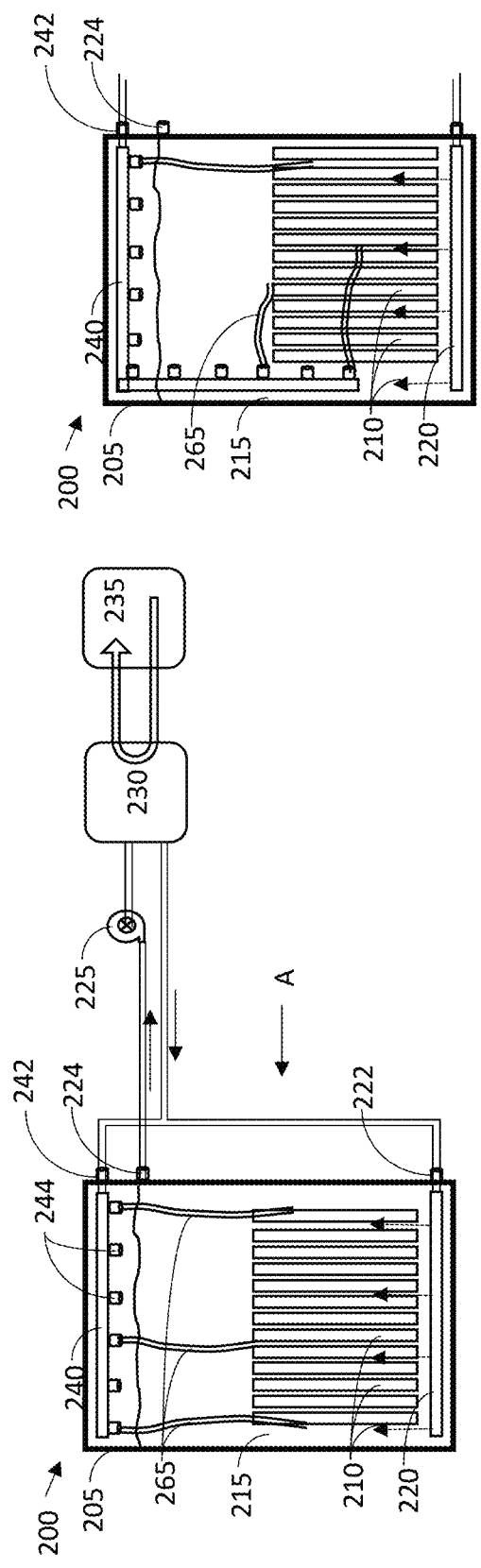
Fig. 1 – Prior Art
Fig. 2A
Fig. 2B
Fig. 2

IMMERSION COOLING SYSTEM HAVING DUAL FLUID DELIVERY LOOPS

FIELD OF THE INVENTION

Embodiments of the present invention relate generally to enhanced and reliable cooling of advanced processors and electronics, specifically to improved immersion cooling for electronic devices.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort needs to be taken to ensure proper heat removal from these chips. A method for cooling, generally referred to as direct immersion cooling, has been introduced using specifically developed liquid. Immersion cooling is a relatively new type of cooling technology implemented currently for servers and data centers, and can be implemented as a single phase or a two phase cooling. In both single and two-phase immersion cooled system the electronic components are submerged directly in a bath of heat transfer liquid. The liquid is a specifically developed liquid which is nonconductive and non-corrosive, so that it may come in direct contact with the electronic devices without affecting the circuitry (e.g., shorting) or harming the devices. The liquid is much better in extracting heat and has a higher heat capacity than air, which means it is more capable for handling high power densities.

When employing single-phase immersion cooling, all of the devices are exposed to the same level of cooling provided by the cooling liquid within the immersion bath. However, various devices may require different level of cooling than other devices within the bath. For example, some high performance devices may generate more heat than other devices within the immersion system thereby creating hot spots, but these devices would be cooled by the same liquid in the bath. While some prior art solutions incorporate a large heat sink attached to these high performance devices, such solutions are inefficient and not highly effective. Thus, the prior art fails to address different requirements of different devices within the immersion system.

BRIEF DESCRIPTION OF THE DRAWINGS

Embodiments of the invention are illustrated by way of example and not limitation in the figures of the accompanying drawings, which are not to scale and in which like references indicate similar elements.

FIG. 1 is a block diagram illustrating an example of a single-phase immersion system according to the prior art.

FIG. 2 is a schematic illustrating a single-phase immersion system according to an embodiment, while FIG. 2A is a schematic illustration of a rear view of the immersion tank and FIG. 2B is a schematic of another embodiment of an immersion tank. FIG. 2C illustrates an example of the supply panel while

DETAILED DESCRIPTION

Figure 2D:
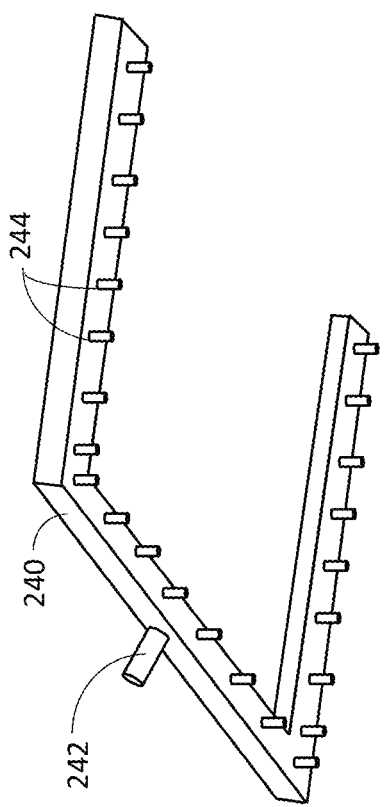
FIG. 2D illustrates an example of a manifold formed in U-shape.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x ##, wherein the first digit x is replaced by the same digit as the figure number, while the next two digits ##are maintained consistent among the embodiments. Consequently, explanation of previously disclosed elements may not be repeated in subsequent embodiments.

FIG. 1 is a general diagram of a conventional single-phase immersion cooling system 100. The system includes a sealed enclosure 105 housing a plurality of servers 110 (generally in the form of exposed PCB boards), which are immersed in cooling liquid pool 115, also may be referred to as immersion tank. As devices within servers 110 operate and generate heat, liquid contacting these devices heats up and rises towards the top of the pool 115. The heated liquid is pumped by pump 125 and is circulated within a heat exchanger 130 (e.g., coolant to water heat exchanger). The heated fluid from the heat exchanger is then exhausted to the atmosphere using heat rejection unit 135, e.g., evaporative cooling tower, dry cooler, chilled water loop, etc. Meanwhile, the cooled liquid from the heat exchanger is returned to the pool 115 by a supply panel 120, as illustrated by the dashed arrows. In this manner, the heat generated by the devices is removed via heating of the coolant in the immersion tank, thence to the fluid (e.g. water) in the heat exchanger 130, and finally to the atmosphere via the heat rejection unit 135. Incidentally, in any of the disclosed embodiments, heat exchanger 130 can perform the operation of exhausting the heat to the atmosphere, thus eliminating the heat rejection unit 135.

As more advanced and high performance chips are incorporated in such systems, they create hot spots because the temperature of the coolant is somewhat uniform in the horizontal direction, and has a somewhat uniform gradient in the vertical direction. Some attempts to resolve this issue have been to attach heat sinks, such as metal blocks with fins, to the advanced devices. However, such passive arrangement does not have the capability to adequately address localized heat generation.

The following embodiments provide a single-phase immersion system which avoids the localized hot spot problem encountered in the prior art. The disclosed embodiments provide two coolant supply lines, one serving to supply coolant to the pool as in the prior art, while a second connects to a manifold to provide coolant to actively cool advanced devices. A single return line is used for both loops. The manifold can be used to connect individual coolant lines to deliver coolant directly to the hot spots. In disclosed embodiments the individual coolant lines can be connected to especially designed cooling devices, such as cooling plates. The coolant supplied directly to the hot spots are thereafter mixed with the coolant in the immersion bath.

FIG. 2 is an illustration conceptually showing the general architecture of a single-phase immersion cooling system according to an embodiment. In this approach the server enclosure 205 houses the servers 210 immersed in immersion liquid bath 215. As devices within servers 210 operate and generate heat, liquid contacting these devices heats up and rises, thus creating a slight vertical temperature gradient. The hotter liquid from the top is then pumped via outlet port 224 by pump 225 to be cooled by heat exchanger 230. The cooled coolant from the heat exchanger 230 is supplied back to the tank 215 via inlet port 222 and supply panel 220. Additionally, a second supply line delivers cooled liquid from the heat exchanger 230 via the second inlet port 242 to the manifold 240, positioned inside the enclosure 205 towards or attached to its ceiling or lid.

The supply panel 220 may simply have a plurality of openings to let received coolant flow into the immersion bath 215, thus it can be referred to as the universal supply. Conversely, the manifold 240 has a plurality of connectors 244, such that fluid delivered into the manifold 240 cannot exit unless a distribution element is connected to one of the connectors 244 via flexible hoses 265, thus it can be referred to a localized supply. The distribution element may be, e.g., a cooling plate, a cooling module, or a sub distribution module (shown in other embodiments). In this embodiment, once fluid is delivered to the distribution element, it exits the distribution element into the immersion tank and mixes with the coolant in the tank. Therefore, in this embodiment only a single return port 224 is used, and it is positioned below the manifold inlet port 242 to return coolant mixed from the universal and the localized supplies.

Figure 2C:
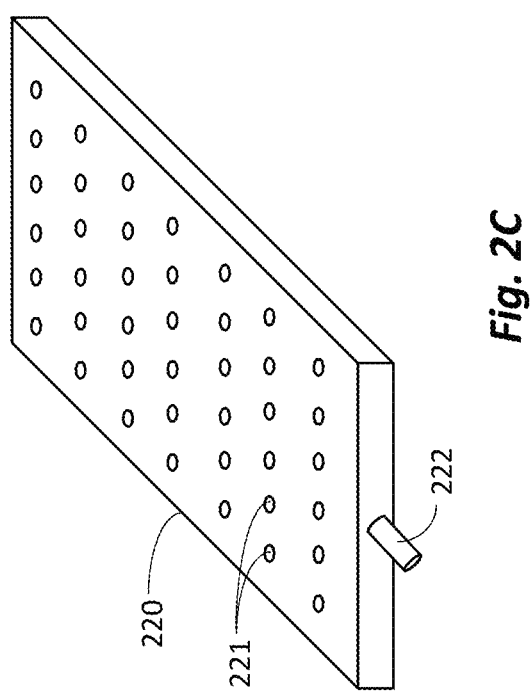

FIG. 2A is a rear-view from direction A indicated in FIG. 2. FIG. 2A illustrates the arrangement of the manifold supply port 242, the return port 224 and the supply panel inlet port 222. The chassis 217 onto which the servers 210 are mounted is indicated in dashed lines. The supply panel 220 may be formed as a large plate covering the entire floor of the immersion tank, and so it appears as a rectangle in both views of FIGS. 2 and 2A. FIG. 2C illustrates one example of a supply panel 220 having inlet port 222 and a plurality of open holes 221 to enable free distribution of fluid entering inlet port 222 out of each of the holes 221. In this particular example the holes are arranged in row which, in some examples, can be aligned to the positions of the electronic boards and/or between the electronic boards. In this manner, it is ensured that flow of freshly delivered coolant flows around each of the boards. In an embodiment, the open holes 221 can be just openings at defined locations matching with servers.

Conversely, the top manifold 240 may be formed in various shapes to enable reaching various devices within the immersed server boards 210. For example, the panel may be formed as one linear pipe, as shown in FIG. 2, or as an open loop, as shown in FIG. 2B. FIG. 2D illustrates another example of the manifold 240 having inlet port 242 and a plurality of connectors 244. In this embodiment the manifold 240 is shaped as a folk or U-shape to run along the interior sidewall of the enclosure 205. Such an arrangement enables free access to the rack and the servers. In preferred embodiments the manifold 240 is shaped such that all of the connectors 244 are above the level of the immersion liquid, so that lines can be connected or disconnected without the need to drain the immersion bath 215. Also, the connectors 244 and all of the ports are preferably dripless quick disconnect connectors, such that no fluid can flow out of a port that is disconnected. Also, the return port 224 is positioned a bit below the fluid level in the coolant tank 215.

Figure 3B:
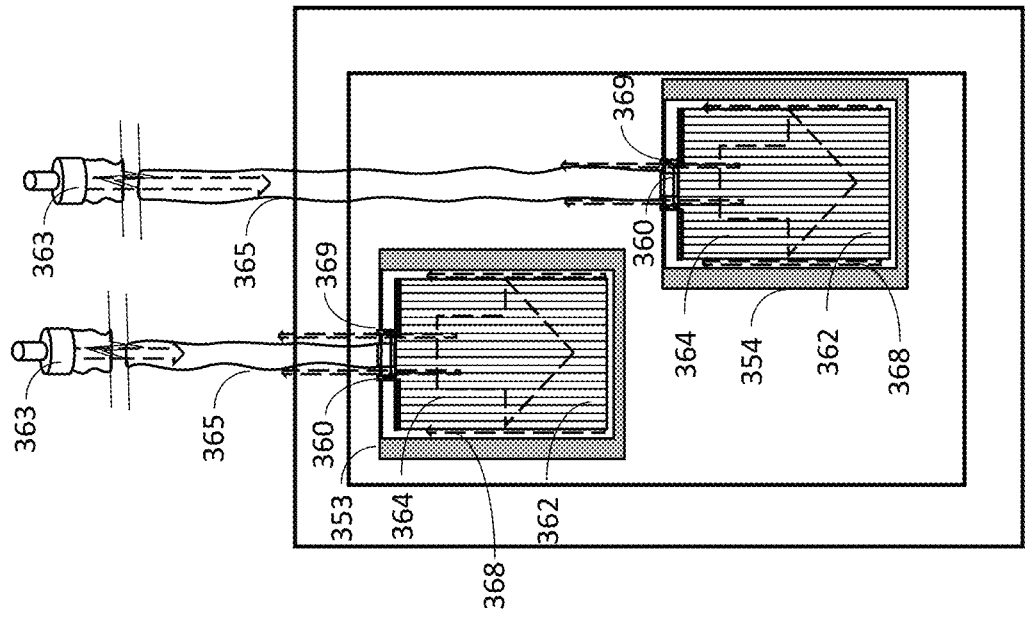
FIGS. 3A-3C illustrate embodiments of localized cooling devices.
Figure 3A:
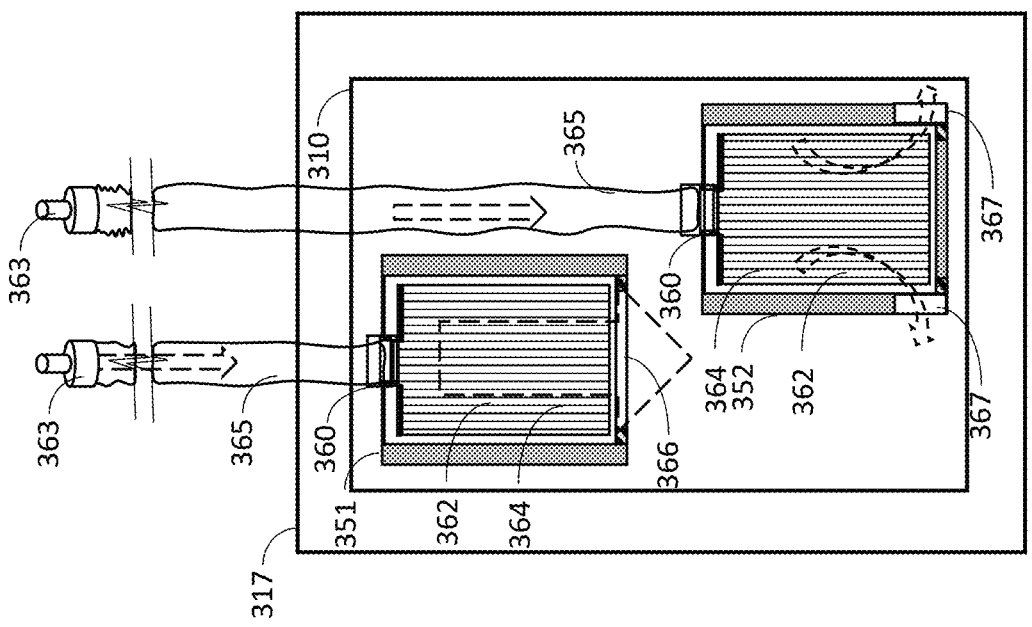
Figure 3C:
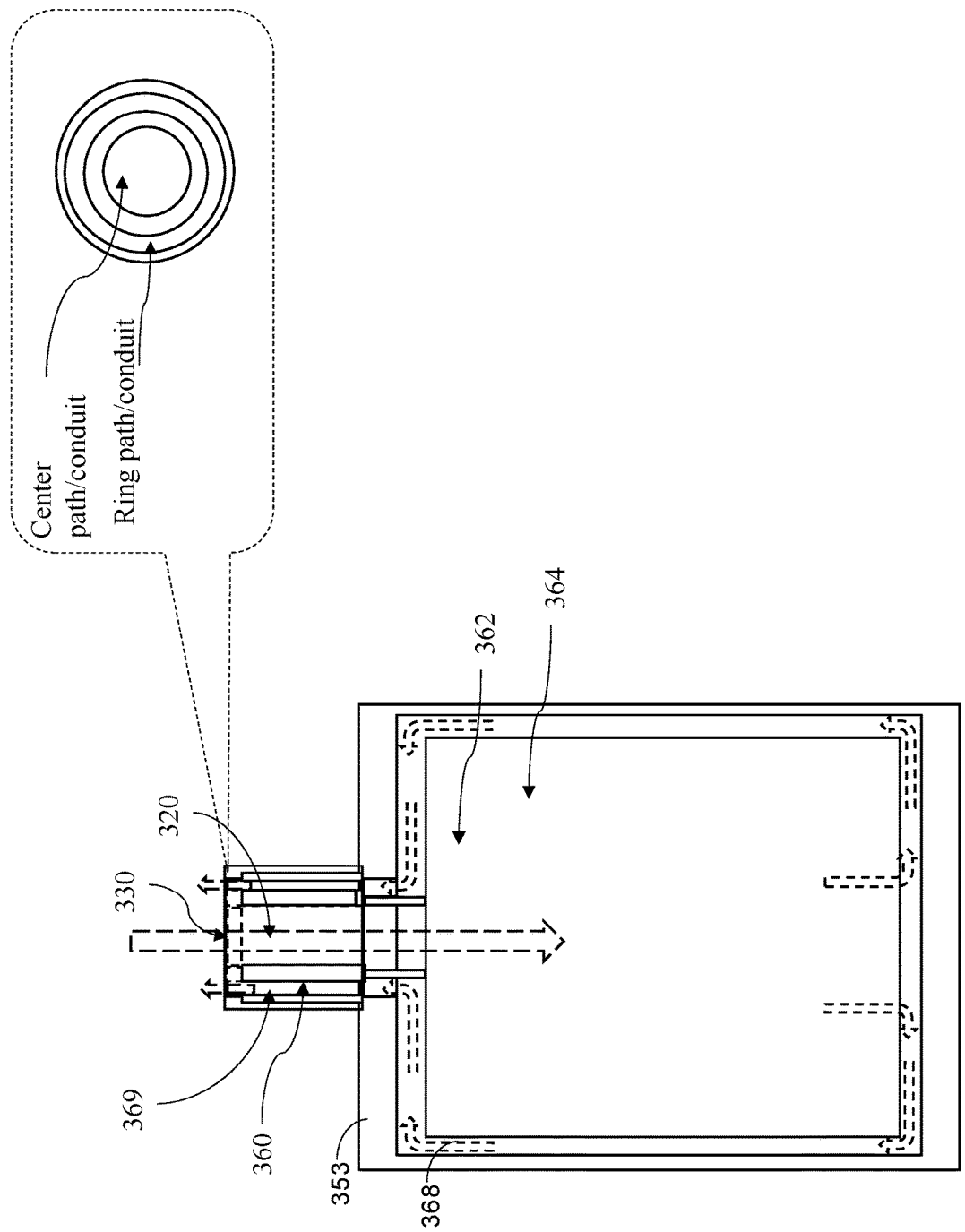

FIGS. 3A-3C illustrate various cooling plates according to various embodiments. Cooling plates are known in the art and are used to cool electronic devices that operate in atmospheric environment. These cooling plates generally have an interior cavity for circulating coolant, an input port with connector and an output port with connector. The input port is connected to coolant supply line and the output port is connected to a return line. The supply and return lines circulate the coolant between the cooling plate and a cooling system, such as a heat exchanger.

In disclosed embodiments, cooling plates are used inside an immersion bath in order to prevent hot spots or to provide enhanced cooling to specific electronic devices. The cooling plates can be also understood as a localized thermal management accelerator especially for hot spot locations. According to disclosed embodiments, the cooling plates have one inlet port with a connector and an opening with no connector for an outlet. In FIGS. 3A and 3B, server board 310 is attached to the chassis 317 and two cooling plates 351-354 are attached to the board 310. Cooling plates 353 and 354 have the same design, so they will not be described separately, but plates 351, 352 and 353 have different designs. Regardless of the design, all of the cooling plates have an inlet port with a connector 360. A flexible hose 365 is connected to the connector 360 on one end and connects to one of the connectors 244 of the distribution plate 240 (FIG. 2) on its other end, thus delivering cold coolant to the cooling plate. Each end of hoses 365 may have a quick disconnect connector 363 mating with a corresponding connector 244 on the manifold and 360 on the cold plate.

The cold coolant passes through a cooling cavity 362, which may include cooling channels formed by, e.g., cooling fins 364. Once the coolant passes through the cavity 362 it simply exits via an outlet hole and mixes with the coolant already in the immersion bath. Three examples for the outlet hole are shown: plate 351 has an outlet hole 366 at the bottom, plate 352 has two outlet holes 367 at each side, which may be formed as perforations. Plates 353 and 354 incorporate a coaxial port arrangement wherein a connector 360 is used for coolant delivery, while a ring opening 369 around the connector 360 is used as the outlet. Additionally, plates 353 and 354 include return channels 368 to return the coolant flowed through the cavity 362 back to the ring opening 369.

FIG. 3C provides a more detailed illustration of the cooling plate design having coaxial port, such as plates 353 and 354. In this embodiment, the cooling plate 353 includes cavity 362 which incorporates cooling fins 364 functioning as flow restrictors to redirect the flow as needed. The cooling fins 364 are arranged to direct the circulating cooling fluid from the inlet, through the cavity 362, and out the outlet in the form of ring opening 369. Different fin designs can be employed to achieve this circulation, and some examples will be provided below. Alternatively, other flow restriction elements can be used to direct the flow of the fluid inside the cavity. FIG 3C also illustrates the inlet port 330 of the cooling plate and a direction 320 of flow into the inlet port 330.

As illustrated in FIG. 3C, the cold plate 353 incorporates a single port, which serves both as an inlet and an outlet. As illustrated by the callout in FIG. 3C, which is a top view, the center path serves as an inlet and the surrounding ring path serves as the return, both of which are arranged coaxially. The connector 360 receives the flexible line to deliver the coolant into the cold plate. As illustrated by the dashed arrows, the coolant then flows in the cooling channels formed by the fins 364, thence to the return channels 368, and then to the outer ring passage, which is opened for free passage of fluid, such that it is used as the return outlet to allow the coolant from the cold plate to flow into the coolant bath 215. Note that the cold plate shown in FIG. 3C is not illustrated as connected with a flexible hose. In one embodiment it is assembled with a flexible hose with two end equipped with quick disconnects, while in another embodiments the cold plate can have a barb on the end connecting with a flexible hose, and the other end of the hose is assembled with the quick disconnects.

Figure 4:
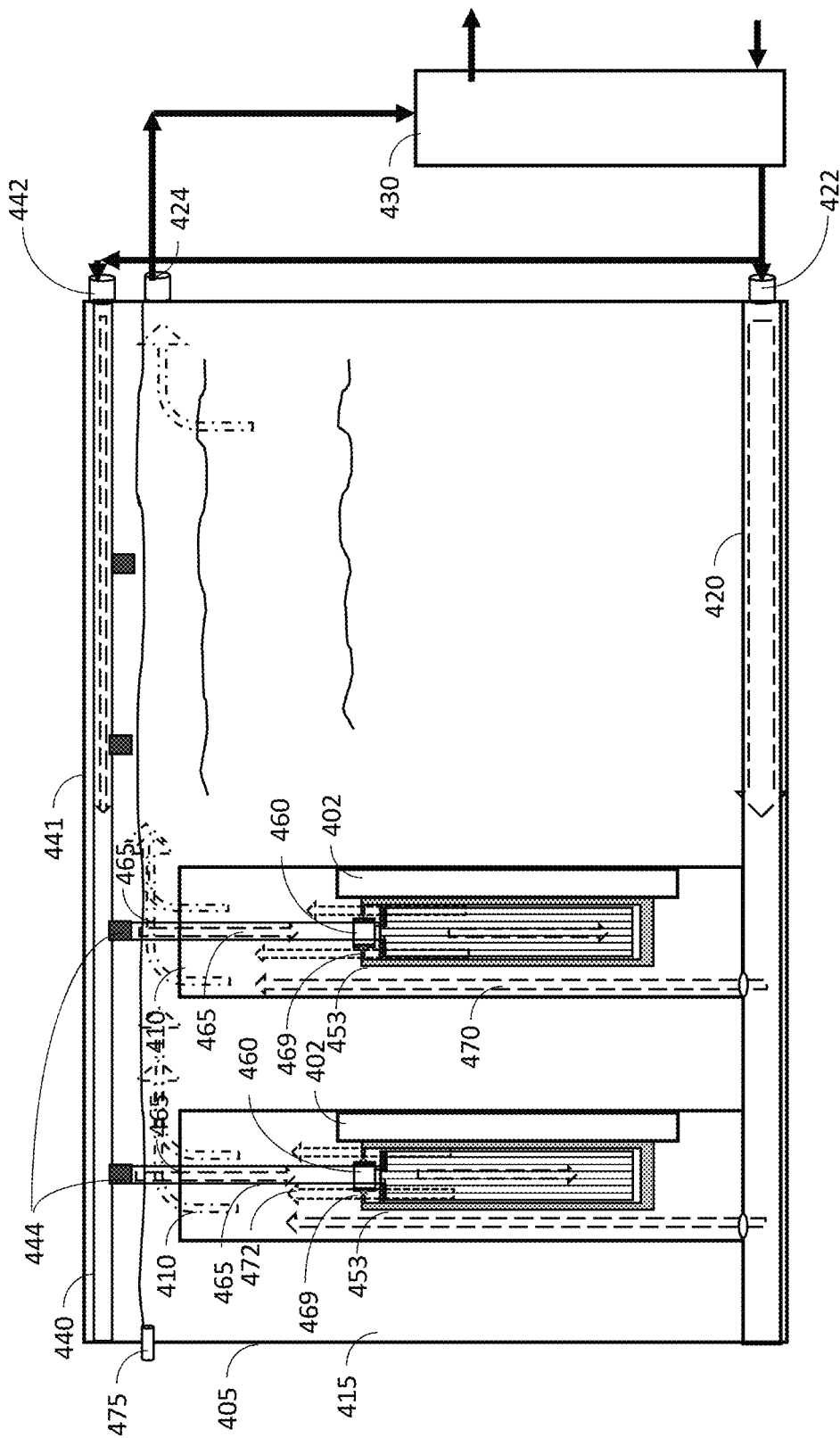
FIG. 4 illustrates a single-phase immersion system according to an embodiment.

FIG. 4 illustrates an embodiment of the overall architecture utilizing immersion cooling with dual fluid delivery loops. The immersion enclosure 405 is shown with two boards 410 mounted therein and immersed in coolant liquid bath 415. In this example one electronic device 402 is shown mounted onto each of the boards 410. A cooling plate 453 is mounted onto each of the devices 402 to provide localized cooling to the devices 402. The coolant in the bath 415 is cooled by circulating in cooler 430, such as a heat exchanger. The coolant is supplied to the bath via the main inlet port 422 and the distribution plate 420, represented by the dashed arrows 470, and is returned to the cooler 430 via the outlet port 424. Additionally, the coolant from the cooler 430 is supplied to the manifold 440 via the secondary inlet port 442, so that it is available through any of the supply connectors 444. Flexible hoses 465 can be connected to the supply connectors and deliver the coolant locally where needed. As shown, each of the two flexible hoses 465 is connected to a cooling plate 453 to deliver cold coolant directly to the device 402. The other two supply connectors shown are not utilized since only two cooling plates are populated in this embodiment. The coolant from the cooling plate 453 is then released to the bath 415, illustrated by dotted arrows 472, and is mixed with the coolant delivered to the bath 415 via the supply plate 420. The mixed coolant is returned via the outlet port 424, as illustrated by the dash-dot arrow.

Incidentally, the outlet port 424 should be below the fluid level in coolant bath 415. Thus, the arrangement of the rack for populating servers should ensure that the servers are fully immersed at all times. In FIG. 4, an optional fluid level sensor 475 is used to monitor the fluid level so that an alarm can be issued if the level drops below acceptable level, risking having the servers above the fluid level, e.g., in case of a leak.

In an embodiment, the supply panel 420 and the manifold 440 are preassembled inside the immersion tank 405. For example, the supply panel 420 may be attached to the floor or the sidewall at the bottom of the bath 415, and the manifold may be attached to the top of the bath 415 or to the lid 441. The electronic boards are preloaded with the cooling plates 453 with the flexible hoses 465 pre-attached to a supply port of each of the cooling plates, e.g., via a quick connect or a barb. The return port of each of the cooling plates may simply be open to the ambient and have no hose connected thereto. The boards are then loaded into the immersion tank and the supply end of each of the hoses attached to the connectors 444 of manifold 440.

Figure 5:
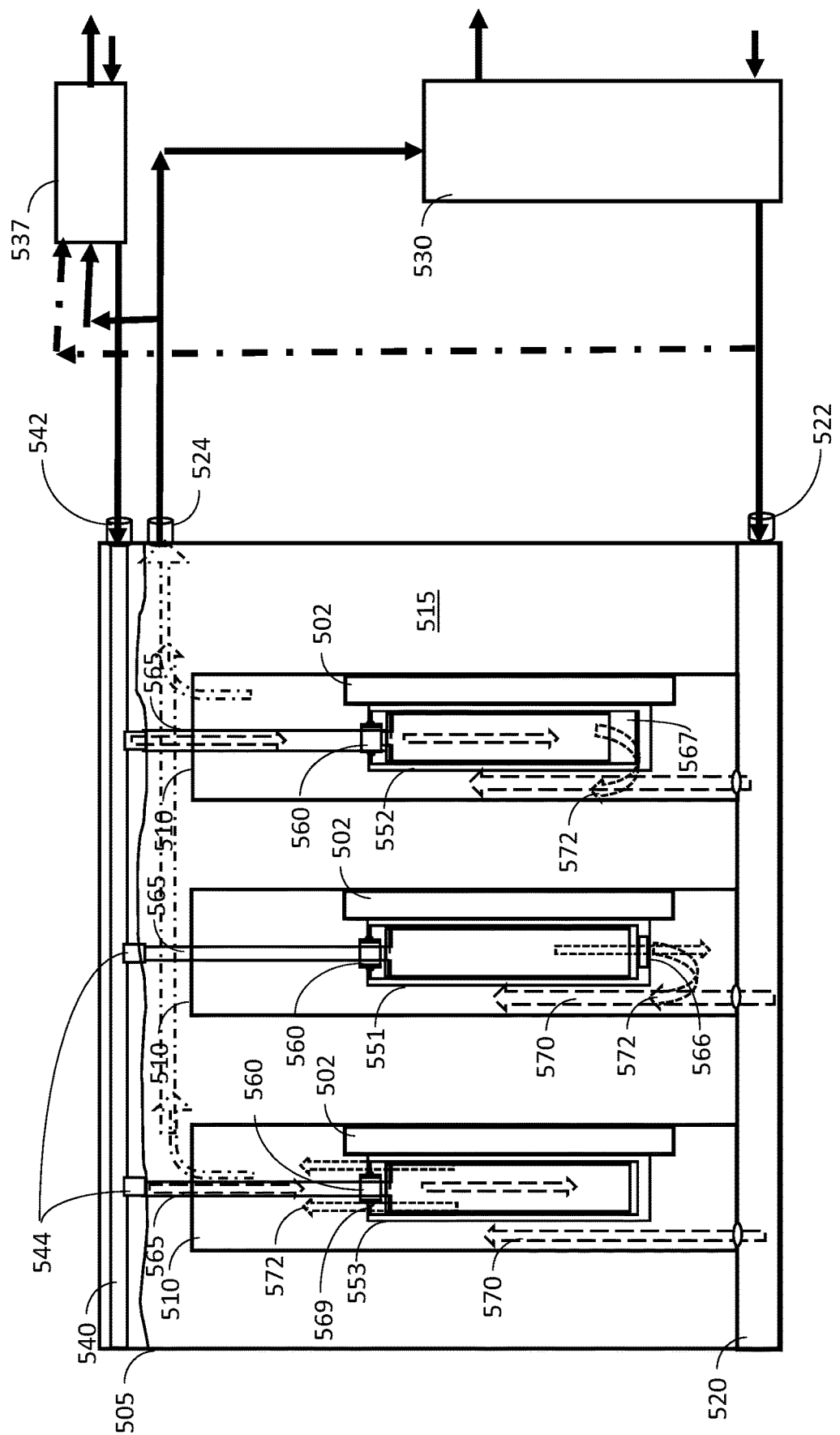
FIG. 5 illustrates another embodiment of a single-phase immersion system.

FIG. 5 illustrates another embodiment of the overall architecture utilizing immersion cooling with dual fluid delivery loops. This particular embodiment illustrates two features: different coolant supply arrangements and different cooling plates design used within the same system. As in other embodiments, the boards 510 are immersed in the immersion bath 515 within enclosure 505. Devices 502 are mounted onto the boards 510 and cooling plates are attached to each of the devices. In one embodiment, the devices may have a smaller foot print than the cooling plate. Here, for demonstration, each of the cooling plates has a different design, namely, plate 553 has an outlet 569 formed coaxially with the inlet connector 560 (See FIG. 3C), plate 551 has an outlet 566 at the bottom, and plate 552 has two outlets 567, one on each side thereof. Any combination of these and similar designs can be used. The idea here is that regardless of the position or design of the outlet, the outlet simply releases the coolant to the surrounding environment, i.e., to the coolant bath 515.

The coolant in the bath 515 is cooled by circulating in main cooler 530, such as a heat exchanger. The coolant is supplied to the bath via the main inlet port 522 and the supply panel 520 and is returned to the cooler 530 via the outlet port 524. Note that the outlet openings in the supply panel 520 are arranged so as to guide the coolant flow to be within the chassis, shown with dashed arrows, so that the flow more efficiently cools the devices of the boards 510.

In this example, the coolant supplied to the manifold 540 via secondary inlet port 542 is provided at a different temperature than that provided by the main cooler 530. Therefore, the coolant to the manifold 540 is supplied from secondary cooler 537. For example, secondary cooler 537 may be a booster cooler receiving the cooled coolant from the main cooler 530 (see dash-dot arrow) and further cooling it. Alternatively, the secondary cooler may receive the coolant from the outlet port 524 (solid arrow) and cool it to its own set temperature, which may be the same or different from that of the main cooler 530. Regardless of the arrangement of the secondary cooler, the coolant is delivered to the cooling plates via lines 565 connected between the manifold 540 and each of the cooling plates. In the disclosed embodiments the lines 565 may have a dripless quick disconnect on one end to be connect with the connector 544 of the manifold 540 and a connector at the other end to be connected to the inlet connector 560 of the cooling plate. When the coolant exits the cooling plates, illustrated by dotted arrows, it mixes with the coolant that is already in the immersion tank and is return via the outlet port 524, exemplified by the dash-dot arrows. However, in other embodiments two completely independent loops can be used for the universal supply of supply panel 520 and localized supply of manifold 540.

Figure 6:
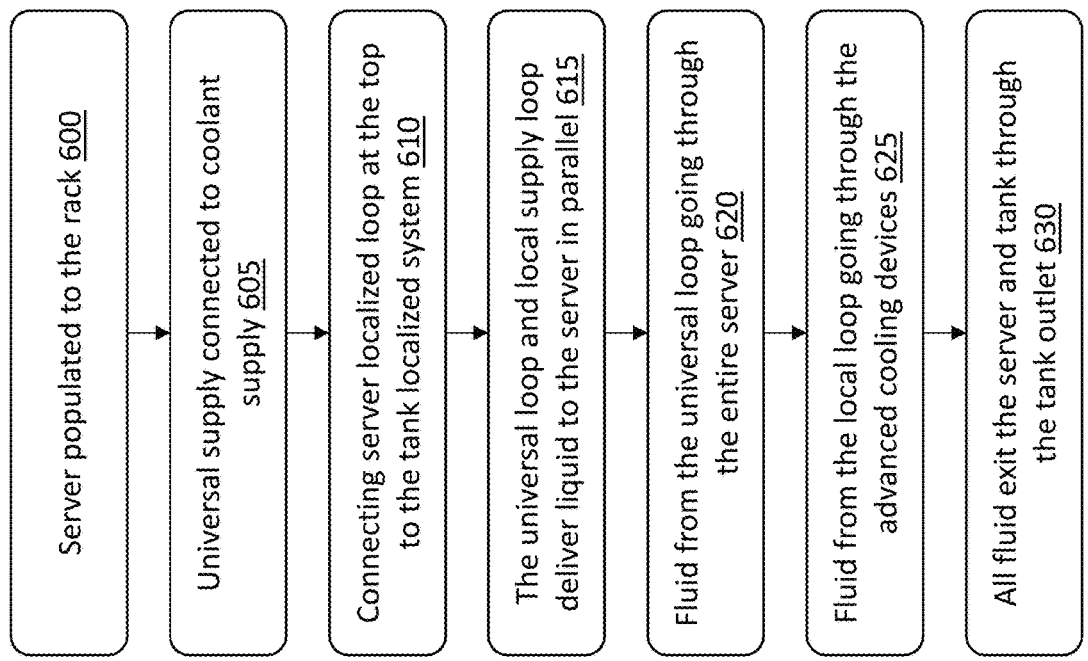
FIG. 6 illustrates a general block chart depicting arrangement and operation of the disclosed embodiments.

FIG. 6 is a general block chart illustrating the features and operations of the disclosed embodiments. At 600 servers are populated in the rack inside the immersion tank. In 605 the universal supply is connected to the coolant supply line to deliver coolant to the supply plate. In 610 the localized loops are connected to provide localized coolant from the manifold to various devices on the servers. In 615, the universal supply loop, which is formed by the supply panel, and the localized supply loop formed by the manifold deliver coolant in parallel. The fluid delivered by the universal supply passes through the entire servers in 620, while fluid delivered by the localized passes through the cooling devices in 625, e.g., cooling plates. The fluid from the universal supply and from the localized supply mix together and exit via the outlet port in 630.

As shown, disclosed embodiments provide an immersion cooling for processors and electronic devices wherein a universal supply delivers cooled coolant to the immersion tank generally, while localized loops deliver cooled coolant to specific cooling devices mounted onto electronic devices. The universal supply is provided by a supply plate positioned at the bottom of the tank, while the localized loops are supplied from a manifold positioned at the top of the tank and having plurality of outlet connectors. The cooling devices have inlet connector that accepts the localized loop flexible hose for receiving cooled coolant, and has an opening for an outlet that releases the coolant to the surrounding immersion tank. The cooling devices may be cooling plates having inlet connector and outlet opening without a connector.

Thus, in disclosed embodiments the immersion cooling system includes an immersion tank with servers immersed in liquid inside the immersion tank; a supply panel is positioned at the bottom of the immersion tank and connected to a main inlet port; a manifold having a plurality of supply connectors and connected to a secondary inlet port is positioned at the top of the immersion tank; and an outlet port is positioned below the secondary inlet port. A plurality of localized loops may be formed by fluidly connecting flexible hoses to the supply connectors and connecting each of the flexible hoses to a cooling device. The cooling device may have one inlet connector and one outlet opening. The coolant may be supplied to the supply panel and the manifold from a single cooler or from separate coolers.

According to further disclosed aspects, a method is provided for cooling processors and electronic devices using immersion, comprising: loading an immersion tank with plurality of electronic boards; attaching to the electronic boards cooling devices; supplying immersion coolant from a cooler to the tank via a supply panel positioned inside the immersion tank; supplying immersion coolant from the cooler to the cooling devices via a manifold positioned inside the immersion tank; discharging the immersion coolant from the cooling devices into the immersion tank; and, removing immersion coolant from the tank via an outlet port to the cooler.

In yet further aspects, a computing facility is disclosed, comprising: a cluster section having a plurality of immersion tanks positioned therein, each of the plurality of immersion tanks having a plurality of computing boards immersed in liquid within the immersion tank; each of the plurality of tanks having a universal liquid delivery and a localized fluid delivery, the universal liquid delivery supplying liquid to the immersion tank and the localized fluid delivery supplying liquid to cooling devices mounted onto the computing boards, the cooling devices having outlet openings to release the liquid into the immersion tank.

Disclosed embodiments implement an acceleration function for heat removal from high performance devices. It enables localized cooling simultaneously and in conjunction with general immersion cooling. The general immersion cooling is implemented using a supply panel having holes aligned to supply coolant flow over the immersed board. The localized cooling is implemented using a manifold having a plurality of dripless quick connect connectors that are used to connect lines to deliver coolant to localized cooling devices, such as cooling plates. When the coolant exits from each of the localized cooling devices it is mixed with the coolant delivered from the supply panel into the immersion tank. The mixed coolant is then circulated through a heat exchanger to provide cooled coolant back to the general immersion and the localized cooling.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system for cooling servers, comprising:
    an immersion enclosure having an immersion tank configured for immersing a plurality of boards in liquid;
    a supply panel positioned at a bottom the immersion enclosure;
    a manifold having a plurality of supply connectors and positioned at a top of the immersion enclosure, wherein liquid delivered into the manifold cannot exit into the immersion tank unless a distribution element in connected to ine of the plurality of supply connectors;
    a main inlet connector coupled to the supply panel;
    a secondary inlet connector coupled to the manifold; and,
    an outlet connector positioned below the secondary inlet connector.

2. The immersion cooling system of claim 1, wherein the plurality of boards have electronic devices, further comprising:
    a plurality of cooling devices mounted onto the electronic devices, each of the cooling devices having a flexible supply hose coupled to one of the supply connectors.

3. The immersion cooling system of claim 2, wherein each of the cooling devices comprises a cooling plate mounted onto an electronic device and having an inlet port and the flexible supply hose coupled to the inlet port.

4. The immersion cooling system of claim 3, wherein each of the cooling plates comprises an internal cavity, an inlet connector mounted onto the inlet port, the flexible hose connected to the inlet connector, and an outlet hole providing free fluid passage from the internal cavity to the immersion tank.

5. The immersion cooling system of claim 4, wherein at least one of the cooling plates comprises a coaxial arrangement having the inlet connector positioned centrally within the outlet hole.

6. The immersion cooling system of claim 1, further comprising a main cooler having a return inlet coupled to the outlet connector and a supply outlet coupled to the main inlet connector.

7. The immersion cooling system of claim 1, wherein the supply panel has a plurality of fluid openings arranged in alignment with the plurality of boards.

8. The immersion cooling system of claim 1, wherein the manifold is formed as U-shaped to enable access to the boards.

9. The immersion cooling system of claim 6, further comprising a secondary cooler having a secondary supply outlet coupled to the secondary inlet connector and a secondary return inlet coupled to the supply outlet of the main cooler.

10. A data center facility comprising:
- a cluster section having at least one immersion tank positioned therein, each of the at least one immersion tank having a plurality of computing boards immersed in liquid within the immersion tank;
- a main cooler providing recirculating liquid to the at least one immersion tank;
- wherein the at least one immersion tank comprises:
- a supply panel having a plurality of outlet holes freely open to the immersion tank and positioned inside the immersion tank;
- a manifold having a plurality of supply connectors and positioned inside the immersion tank, wherein liquid delivered into the manifold cannot exit into the immersion tank unless a distribution element is connected to one of the plurality of supply connectors;
- a main inlet connector coupled to the supply panel and fluidly coupled to the main cooler;
- a secondary inlet connector coupled to the manifold; and,
- an outlet connector fluidly coupled to the main cooler.

11. The data center facility of claim 10, wherein the secondary inlet connector is fluidly coupled to the main cooler.

12. The data center facility of claim 11, further comprising a secondary cooler and wherein the secondary inlet connector is fluidly coupled to the secondary cooler.

13. The data center facility of claim 12, wherein the plurality of outlet holes are aligned to the computing boards.

14. The data center facility of claim 10, further comprising a plurality of cooling plates mounted onto the computing boards and a plurality of flexible hoses coupled between the cooling plates and the supply connectors.

15. The data center facility of claim 14, wherein each of the cooling plates comprises an internal cavity, an inlet connector, and an outlet hole providing free fluid passage from the internal cavity to the immersion tank.

16. The data center facility of claim 15, wherein the at least one of the cooling plates comprises a coaxial arrangement having the inlet connector positioned centrally within the outlet hole.

* * * * *